(12) United States Patent
Girani et al.

(10) Patent No.: US 12,283,958 B2
(45) Date of Patent: Apr. 22, 2025

(54) DRIVER CIRCUIT FOR LOW VOLTAGE DIFFERENTIAL SIGNALING, LVDS, LINE DRIVER ARRANGEMENT FOR LVDS AND METHOD FOR OPERATING AN LVDS DRIVER CIRCUIT

(71) Applicant: ams-Osram AG, Premstätten (AT)

(72) Inventors: Elisa Girani, Pavia (IT); Dominik Ruck, Lannach (AT)

(73) Assignee: AMS-OSRAM AG, Premstatten (AT)

( * ) Notice: Subject to any disclaimer, the term of this patent is extended or adjusted under 35 U.S.C. 154(b) by 225 days.

(21) Appl. No.: 18/002,419

(22) PCT Filed: May 17, 2021

(86) PCT No.: PCT/EP2021/062997
§ 371 (c)(1),
(2) Date: Dec. 19, 2022

(87) PCT Pub. No.: WO2022/002475
PCT Pub. Date: Jan. 6, 2022

(65) Prior Publication Data
US 2023/0231476 A1 Jul. 20, 2023

(30) Foreign Application Priority Data
Jun. 29, 2020 (EP) .................................... 20182953

(51) Int. Cl.
*H03K 5/01* (2006.01)
*H03K 5/00* (2006.01)
*H03K 19/20* (2006.01)

(52) U.S. Cl.
CPC ..... *H03K 5/01* (2013.01); *H03K 2005/00286* (2013.01); *H03K 19/20* (2013.01)

(58) Field of Classification Search
CPC .............. H03K 5/01; H03K 19/20; H03K 2005/00286; H03K 19/094; H03K 5/151;
(Continued)

(56) References Cited

U.S. PATENT DOCUMENTS 6,313,662 B1 11/2001 Ide
10,079,603 B1 9/2018 Panigrahi
(Continued)

FOREIGN PATENT DOCUMENTS

DE 102010046686 B3 1/2012
EP 1265361 A2 12/2002
(Continued)

OTHER PUBLICATIONS

Korean Office Action issued in corresponding Korean Patent Application No. 10-2023-7003014 dated May 22, 2024 with English language translation.
(Continued)

*Primary Examiner* — Jung Kim
(74) *Attorney, Agent, or Firm* — MH2 Technology Law Group LLP

(57) ABSTRACT

A driver circuit for low voltage differential signaling, LVDS, includes a phase alignment circuit including an input configured to receive an input signal, a first output configured to provide an internal signal as a function of the input signal, and a second output configured to provide an inverted internal signal, which is the inverted signal of the internal signal, and an output driver circuit coupled to the phase alignment circuit, the output driver circuit including a first input configured to receive the internal signal, a second input configured to receive the inverted internal signal, a first output configured to provide an output signal as a function of the internal signal and a second output configured to provide an inverted output signal which is the inverted
(Continued)

signal of the output signal. The phase alignment circuit provides the inverted internal signal with its phase aligned to a phase of the internal signal.

8 Claims, 4 Drawing Sheets

(58) Field of Classification Search
CPC ..... H03K 2005/00293; H03K 19/0944; H03K 19/0948; H03K 19/096; H03K 19/0963; H03K 5/1515
See application file for complete search history.

(56) References Cited

U.S. PATENT DOCUMENTS

| 2003/0042959 | A1 | 3/2003 | Song |
| 2007/0222479 | A1 | 9/2007 | Aoki |
| 2008/0265964 | A1 | 10/2008 | Park |
| 2011/0006851 | A1 | 1/2011 | Kim |
| 2013/0082743 | A1* | 4/2013 | Sato ........................ H03K 5/151 327/107 |

FOREIGN PATENT DOCUMENTS

| KR | 2003-0021429 A | 3/2003 |
| KR | 20080095613 A | 10/2008 |
| KR | 20110005056 A | 1/2011 |
| WO | 9424797 A1 | 10/1994 |

OTHER PUBLICATIONS

Tajalli et al., "A Slew Controlled LVDS Output Driver Circuit in 0.18 μm CMOS Technology", IEEE Journal of Solid-State Circuits, vol. 44, No. 2, Feb. 2009, 11 pages.

Mesplede, Delphine (EP Authorized Officer), International Search Report and Written Opinion in corresponding International Application No. PCT/EP2021/062997 mailed on Aug. 6, 2021, 12 pages.

Korean Notice of Allowance issued in corresponding Korean Patent Application No. 10-2023-7003014 dated Nov. 8, 2024 with English language translation, 7 pages.

* cited by examiner

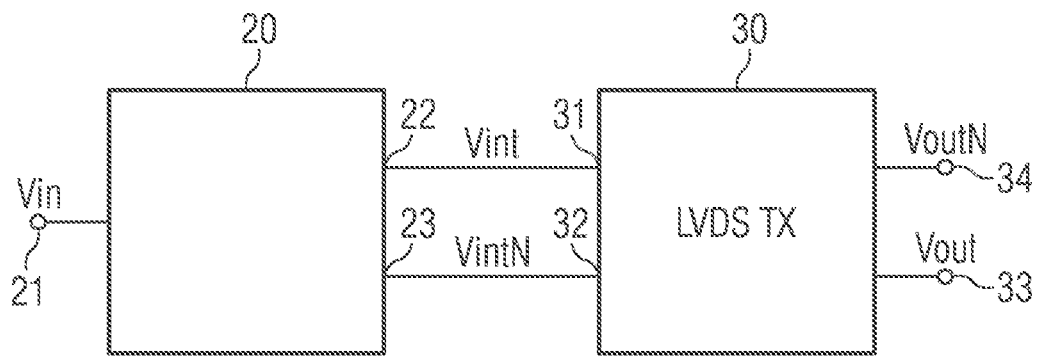
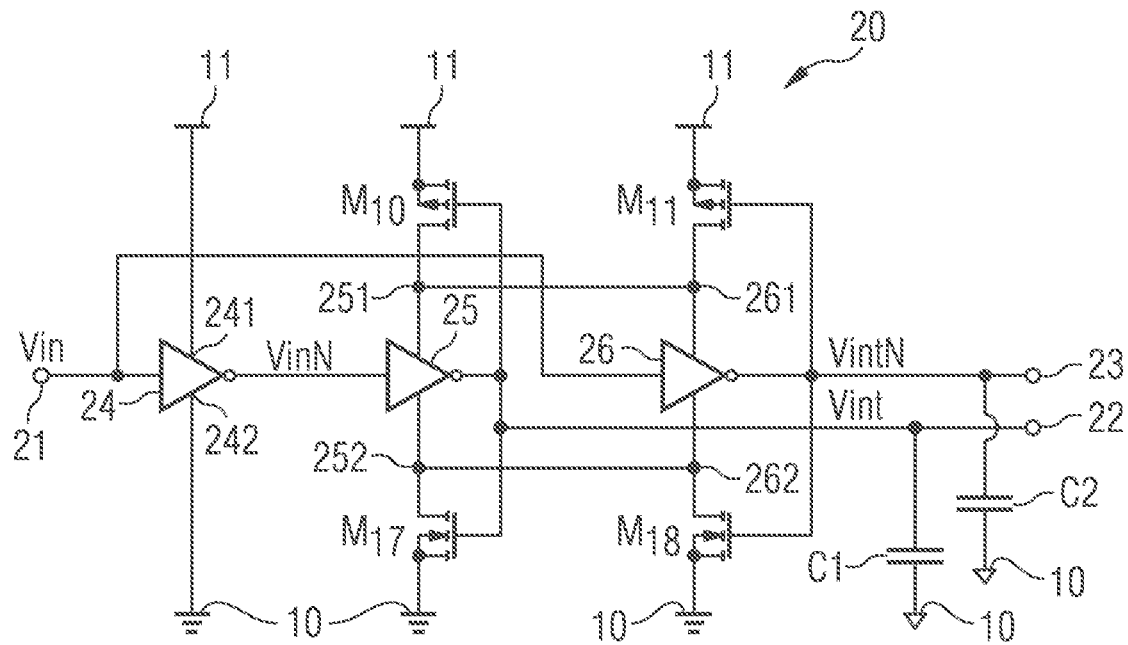

DRIVER CIRCUIT FOR LOW VOLTAGE DIFFERENTIAL SIGNALING, LVDS, LINE DRIVER ARRANGEMENT FOR LVDS AND METHOD FOR OPERATING AN LVDS DRIVER CIRCUIT

CROSS-REFERENCE TO RELATED APPLICATIONS

The present application is the national stage entry of International Patent Application No. PCT/EP2021/062997, filed on May 17, 2021, and published as WO 2021/002475 A1 on Jan. 6, 2022, which claims the benefit of priority of EP Patent Application No. 20182953.8, filed on Jun. 29, 2020, the disclosures of all of which are incorporated by reference herein in their entireties.

FIELD

The present disclosure relates to the field of low voltage differential signaling, LVDS. Specifically, the application is directed to a driver circuit for LVDS, a line driver arrangement for LVDS and a method for operating an LVDS driver circuit.

BACKGROUND

LVDS, also known as ANSI/TIA/EIA-644, is a technical standard that specifies electrical characteristics of a differential, serial communication protocol, which is employed in automotive applications, autonomous driving, or obstacle detection, for example. LVDS operates at low power and provides reliable transmission at very high speeds, e.g. in GBit per second range, using twisted-pair copper cables. In other words, LVDS is a physical layer specification for a two-wire interface. A transmitter injects a constant current of about 3.5 mA into the wires. A direction of the injected current represents the digital logic level, i.e. the information to be transmitted. The current passes through one wire and a termination resistor at a receiving end. The resistance of the termination resistor is matched to the cable's characteristic impedance to reduce reflections and typically amounts to about 100 to 120 ohms. The current then returns in the opposite direction, i.e. to the transmitter, via the other wire. At the receiving end the two wire voltages are compared and a polarity of a voltage drop across the termination resistor, i.e. the differential voltage, is sensed to determine the logic level of the transmitted piece of information. The voltage drop across the termination resistor typically is about 350 mV.

Recently LVDS drivers have been designed to operate at reduced supply voltages. In order to accomplish this, said drivers either rely on a diminished output swing or sacrifice the fully differential topology. It is also necessary to apply proper termination schemes to avoid fast transitions or ringing caused by incomplete impedance matching in different points of the transmission system. The fast transitions contain high frequency components which directly affect the electromagnetic radiation, EMR, created by the transmitted signal, which may result in electromagnetic compatibility, EMC, problems.

Due to several non-idealities of the involved components, e.g. non-ideal transmission line characteristics, imperfect termination, pad parasitic effects, and timing of the input signals, voltage spikes or ringing can be observed at the output of LVDS driver.

Specifically, poor timing of the input signals may cause an unwanted delay or time shift between the signal to be transmitted and its inverted signal which is generated by a driver on the transmitter side for the differential signaling. This time shift is seen as a non-ideal impedance matching at the output of the transmitter. In the state of the art this time shift is overcome e.g. by using inverters of different speed. In a different approach a slope of the waveform of the driver's output voltage is controlled.

However, with said approaches it is difficult to satisfy all of the different process corners, i.e. extreme variations of fabrication parameters like doping under which an integrated circuit must function correctly, and temperature variations. The time shift between the differential signals can be negligible at low frequency and becomes much more evident at higher frequencies. Controlling the output slope of the driver tends to be power consuming and may not be suitable for a multipurpose LVDS which operates at different frequencies.

One objective can therefore be seen in providing a driver circuit for LVDS, a line driver arrangement for LVDS and a method for operating an LVDS driver circuit which reduces non-idealities at the output of the driver.

The object is achieved by the subject-matter of the independent claims. Embodiments and developments are defined in the dependent claims.

SUMMARY

In one embodiment a driver circuit for low voltage differential signaling, LVDS, comprises a phase alignment circuit and an output driver circuit. The phase alignment circuit comprises an input configured to receive an input signal, a first output configured to provide an internal signal as a function of the input signal, and a second output configured to provide an inverted internal signal, which is the inverted signal of the internal signal. The output driver circuit is coupled to the phase alignment circuit and comprises a first input configured to receive the internal signal, a second input configured to receive the inverted internal signal, a first output configured to provide an output signal as a function of the internal signal and a second output configured to provide an inverted output signal which is the inverted signal of the output signal. Therein the phase alignment circuit is configured to provide the inverted internal signal with its phase being aligned to a phase of the internal signal.

The input signal is supplied to the input of the phase alignment circuit of the driver circuit for LVDS. The phase alignment circuit generates the internal signal as a function of the input signal. The phase alignment circuit also generates the inverted internal signal. Thereby, the phase of the inverted internal signal is aligned to the phase of the internal signal. The output driver circuit receives the internal signal and the inverted internal signal and therefrom provides the output signal and the inverted output signal.

The phase alignment circuit generates the internal signal and the inverted internal signal with their edges being in phase with each other. Consequently, these signals when changing their logical state cross at the middle of a supply voltage which supplies the driver circuit. Timing non-idealities at the input of the output driver are mostly removed. As the driver circuit for LVDS generates the output signal and the inverted output signal using the internal signal and the inverted internal signal, the output signal and the inverted output signal are also aligned to each other in phase.

By this, the output waveform of the driver circuit for LVDS is soothed and non-idealities are reduced.

Also, the proposed driver circuit for LVDS, i.e. LVDS driver circuit, is enabled to work at different frequencies, close to the limit of the structure, with lower power consumption in comparison to the prior art.

The definitions of terms provided in the above also apply to the following description unless stated otherwise.

In a development the phase alignment circuit comprises a first inverter, a second inverter, and a third inverter. The first inverter has an input which is connected to the input of the phase alignment circuit, an output configured to provide an inverted input signal from the input signal, a first inverter supply terminal which is connected to a supply voltage terminal, and a first inverter reference terminal which is connected to a reference voltage terminal. The second inverter has an input which is connected to the output of the first inverter, an output configured to provide the internal signal from the inverted input signal, a second inverter supply terminal which is connected to the supply voltage terminal via a first switch, and a second inverter reference terminal which is connected to the reference voltage terminal via a second switch. The third inverter has an input which is connected to the input of the first inverter and an output configured to provide the inverted internal signal from the input signal. The third inverter further has a third inverter supply terminal which is connected to the second inverter supply terminal of the second inverter and to the supply voltage terminal via a third switch, and a third inverter reference terminal which is connected to the second inverter reference terminal of the second inverter and to the reference voltage terminal via a fourth switch.

The first inverter receives the input signal and therefrom provides the inverted input signal by signal inversion. The second inverter receives the inverted input signal and therefrom provides the internal signal by inverting the inverted input signal. The third inverter receives the input signal, inverts the input signal and therefrom provides the inverted internal signal at the second output of the phase alignment circuit. By means of the first, the second, the third and the fourth switch, the inversion of the inverted input signal and provision of the internal signal of the second inverter is synchronized in time with the inversion of the input signal and provision of the inverted internal signal by the third inverter.

By this, an edge of the internal signal is in phase with an edge of the inverted input signal, advantageously.

In a development the first switch has a control input which is connected to the output of the second inverter. The second switch has a control input which is connected to the output of the second inverter, as well. The third switch has a control input which is connected to the output of the third inverter. The fourth switch has a control input which is also connected to the output of the third inverter.

The coupling of the switches amongst each other and to the second and third inverter, respectively, enables synchronization of the phases of the internal signal and the inverted input signal. Consequently, the internal signal and the inverted input signal when changing their respective logical state cross at the middle of the supply voltage which is supplied to the supply voltage terminal.

In a development the first inverter comprises a first pair of complementary metal-oxide-semiconductor, MOS, transistors. The second inverter comprises a second pair of complementary MOS transistors. The third inverter comprises a third pair of complementary MOS transistors.

In another development the first switch comprises a MOS transistor with a controlled section connected between the supply voltage terminal and the second inverter supply terminal of the second inverter. The second switch comprises a MOS transistor with a controlled section connected between the reference voltage terminal and the second inverter reference terminal of the second inverter. The third switch comprises a MOS transistor with a controlled section connected between the supply voltage terminal and the third inverter supply terminal of the third inverter. The fourth switch comprises a MOS transistor with a controlled section connected between the reference voltage terminal and the third inverter reference terminal of the third inverter.

In a MOS transistor the controlled section extends between its source and drain terminals. Its gate terminal represents its control input.

In a development the phase alignment circuit further comprises a first and a second capacitor. The first capacitor is coupled to the first output of the phase alignment circuit and to the reference voltage terminal. The second capacitor is coupled to the second output of the phase alignment circuit and to the reference voltage terminal.

First and second capacitors realize a capacitive load at the output of the phase alignment circuit for even better control of the slope of the internal signal and the inverted internal signal. The capacitance values of first and second capacitors are adapted to each other, i.e. the capacitance values of first and second capacitor are substantially equal. The capacitance values may also be variable to adjust to different needs.

In a further development the input signal comprises a digital signal.

The input signal comprises the information to be transmitted using the LVDS driver circuit specified above. The input signal therefore may assume different logical levels, for example, a high level corresponding to a value one, or a low level corresponding to a value zero. An inverted signal has the opposite logical level of the original signal.

In a further development the output driver circuit is configured to provide the output signal and the inverted output signal using a constant current. Therein a direction of the current represents a logical level of the output signal and the inverted output signal.

The output driver circuit provides the output signal and the inverted output signal conforming to the requirements defined in the LVDS standard ANSI/TIA/EIA-644. As the internal signal and the inverted input signal are in phase with each other and are used as input signals of the output driver circuit, the output signal and the inverted output signal are also aligned in phase to each other. Overshooting of the first and second output of the output driver circuit is avoided independent of the frequency of the input signal.

In one embodiment a line driver arrangement for LVDS comprises the driver circuit as specified above. Therein the input signal comprises a voltage signal and the output signal and the inverted output signal represent a differential voltage output signal of the line driver arrangement.

The line driver arrangement conforms to the LVDS standard. Advantageously it provides the differential voltage output signal with edges being aligned in phase to each other, i.e. with non-idealities being removed.

In one embodiment a method for operating an LVDS driver circuit comprises the steps of:
  receiving an input signal at an input of a phase alignment circuit of the LVDS driver circuit,
  generating, by the phase alignment circuit, an internal signal as a function of the input signal, generating, by the phase alignment circuit, an inverted internal signal, which is the inverted signal of the internal signal, a phase of the inverted internal signal being aligned to a phase of the internal signal, supplying, by the phase alignment circuit, the internal signal and the inverted internal signal to an output driver circuit of the LVDS driver circuit and therefrom providing, by the output driver circuit, an output signal and an inverted output signal.

Due to the generation of the inverted internal signal and the internal signal with their phases being aligned to each other, the output driver circuit is enabled to provide the output signal and the inverted output signal also with their phases being synchronized to each other. Thereby, overshoot of the output signal or the inverted output signal is avoided independent of the frequency of the input signal. Non-idealities are reduced.

The method may be used for operating the driver circuit for LVDS specified above.

In a development the generating an internal signal as a function of the input signal comprises the steps of:
inverting the input signal and therefrom providing an inverted input signal,
inverting the inverted input signal and therefrom providing the internal signal,
and wherein the generating the inverted internal signal comprises
inverting the input signal and therefrom providing the inverted internal signal,
wherein the inverting the inverted input signal and therefrom providing the internal signal is synchronized in time with the inverting the input signal and therefrom providing the inverted internal signal.

In a development an edge of the internal signal is in phase with an edge of the inverted input signal.

Synchronization of the edges of the internal signal and the inverted internal signal and usage of the internal and the inverted input signals in the provision of the output signal and the inverted output signal achieves an acceptable output waveform without voltage spikes independent of the input signal frequency and of process variations. Moreover, compared with state of the art approaches, less power is consumed.

The text below explains the proposed LVDS driver circuit and corresponding method in detail using exemplary embodiments with reference to the drawings. Components and circuit elements that are functionally identical or have the identical effect bear identical reference numbers. In so far as circuit parts or components correspond to one another in function, a description of them will not be repeated in each of the following figures. Therein,

BRIEF DESCRIPTION OF THE DRAWINGS

FIG. 1 shows an exemplary embodiment of the proposed driver circuit for LVDS,

FIG. 2 shows an exemplary embodiment of the proposed phase alignment circuit,

DETAILED DESCRIPTION

Figure 3:
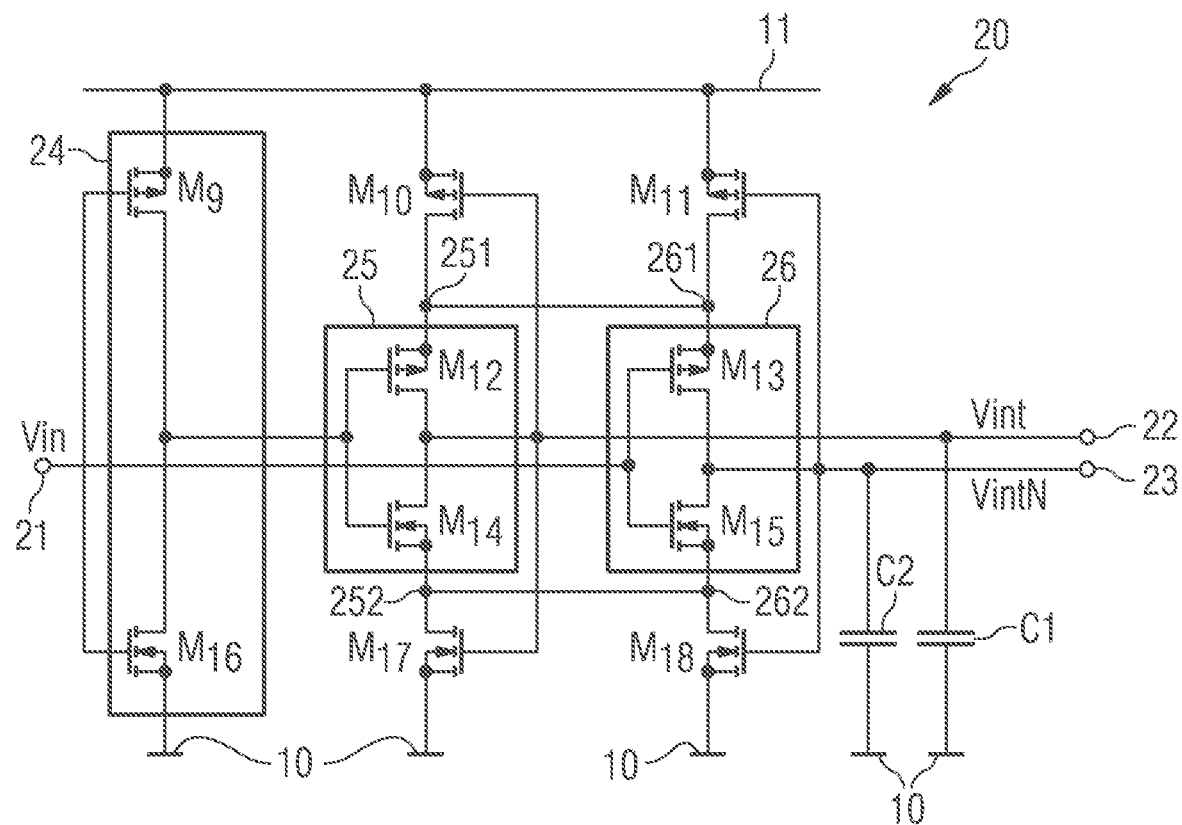
FIG. 3 shows an exemplary implementation of the proposed phase alignment circuit.

FIG. 1 shows an exemplary embodiment of the proposed driver circuit for LVDS. The driver circuit comprises a phase alignment circuit 20 and an output driver circuit 30. The phase alignment circuit 20 comprises an input 21, a first output 22 and a second output 23. The input 21 is configured to receive an input signal Vin. The first output 22 is configured to provide an internal signal Vint which is a function of the input signal Vin. The second output 23 is configured to provide an inverted internal signal VintN, which is the inverted signal of the internal signal Vint, or in other words, the inverted form of the internal signal Vint. The output driver circuit 30 is coupled to the phase alignment circuit 20. The output driver circuit 30 has a first input 31, a second input 32, a first output 33 and a second output 34. The first input 31 is connected to the first output 22 of the phase alignment circuit 20. The first input 31 is configured to receive the internal signal Vint. The second input 32 of the output driver circuit 30 is connected to the second output 23 of the phase alignment circuit 20. The second input 32 of the output driver circuit 30 is configured to receive the inverted internal signal VintN. The first output 33 of the output driver 30 is configured to provide an output signal Vout as a function of the internal signal Vint. The second output 34 of the output driver circuit 30 is configured to provide an inverted output signal VoutN which is the inverted signal of the output signal Vout or, in other words, the output signal Vout in its inverted form.

The connection between the first output 22 of the phase alignment circuit 20 and the first input 31 of the output driver circuit 30, as well as the connection between the second output 23 of the phase alignment circuit 20 and the second input 32 of the output driver circuit 30 may each be realized as a direct connection without any additional circuit elements in between.

The phase alignment circuit 20 receives the input signal Vin and therefrom provides the internal signal Vint and the inverted internal signal VintN, wherein a phase of the inverted internal signal VintN is aligned to a phase of the internal signal Vint. The output driver circuit 30 uses the internal signal Vint and the inverted internal signal VintN and therefrom provides the output signal Vout and the inverted output signal VoutN, e.g. as a differential voltage having a constant current level. The input signal Vin comprises a digital signal, e.g. a voltage.

The phase alignment circuit 20 generates from the single-ended input signal Vin the differential signals, i.e. the internal signal Vint and the inverted internal signal VintN with their phases being aligned to each other. This means that, for instance, a rising edge of the internal signal Vint which is a function of a rising edge of the input signal Vin, is synchronized in time with a falling edge of the inverted internal signal VintN. In other words, the internal signal Vint and the inverted internal signal VintN cross at the middle of the input voltage range which is defined by the supply voltage, for instance, upon occurrence of a level change of the input signal Vin. As a consequence, the differential signals at the output 34 and 33 of the output driver circuit 30 are also synchronized in phase with each other, crossing at the middle of the supply voltage level when a level change of the input signal Vin occurs. Overshoots and spikes at the outputs 33 and 34 are avoided independent of the frequency of the input signal Vin.

FIG. 2 shows an exemplary embodiment of the proposed phase alignment circuit. The phase alignment circuit 20 comprises a first inverter 24, a second inverter 25, and a third inverter 26. Furthermore, the phase alignment circuit 20 comprises a first switch M10, a second switch M17, a third switch M11, and a fourth switch M18. The first inverter 24 has an input which is coupled to the input 21 of the phase alignment circuit 20. The first inverter 24 further has a first inverter supply terminal 241, which is connected to a supply voltage terminal 11 and a first inverter reference terminal 242, which is connected to a reference voltage terminal 10. The first inverter 24 further has an output configured to provide an inverted input signal VinN from the input signal Vin.

The second inverter 25 has an input which is directly connected to the output of the first inverter 24. The second inverter 25 further has a second inverter supply terminal 251 which is connected to the supply voltage terminal 11 via the first switch M10. The second inverter 25 also has a second inverter reference terminal 252, which is connected to the reference voltage terminal 10 via the second switch M17. The second inverter 25 has an output which is configured to provide the internal signal Vint from the inverted input signal VinN.

The third inverter 26 has an input which is directly connected to the input 21 of the phase alignment circuit 20. The third inverter 26 further has a third inverter supply terminal 261, which is connected to the second inverter supply terminal 251 of the second inverter 25 in a direct manner. The third inverter supply terminal 261 is further connected to the supply voltage terminal 11 via the third switch M11. The third inverter 26 also has a third inverter reference terminal 262 which is connected to the second inverter reference terminal 252 of the second inverter 25 in a direct manner. The third inverter reference terminal 262 is also connected to the reference voltage terminal 10 via the fourth switch M18. The third inverter 26 also has an output which is configured to provide the inverted internal signal VintN from the input signal Vin.

The phase alignment circuit 20 further has a first and a second capacitor C1, C2. The first capacitor C1 is connected, on the one hand, to the first output 22 of the phase alignment circuit 20 and, on the other hand, to the reference voltage terminal 10. The second capacitor C2 is connected, on the one hand, to the second output 23 of the phase alignment circuit 20 and, on the other hand, to the reference voltage terminal 10.

The supply voltage terminal 11 is supplied by a supply voltage, while the reference voltage terminal is connected to a reference voltage, for instance ground.

The first inverter 24 receives the input signal Vin and therefrom provides the inverted input signal VinN by signal inversion. The second inverter 25 receives the inverted input signal VinN and therefrom generates the internal signal Vint by signal inversion. The third inverter 26 receives the input signal Vin and therefrom generates the inverted internal signal VintN by signal inversion. Operation of the second inverter 25 is synchronized with operation of the third inverter 26 by means of the four switches M10, M11, M17 and M18, as well as the direct connection between the inverter supply terminals 251 and 261 and the direct connection between the inverter reference terminals 252 and 262. For this, a control input of the first and the second switch M10, M17 is directly connected to the output of the second inverter 25, and a control input of the third switch M11 and the fourth switch M18 is directly connected to the output of the third inverter 26.

The four switches M10, M17, M11, M18 are each realized as MOS transistors. In the example depicted in FIG. 2, the first and the third switch M10 and M11 are each realized as PMOS transistors, whereas the second and the fourth switch M17, M18 are each realized as NMOS transistors. The transistors are adapted in size to each other.

In an example, the input signal Vin is at low level or zero. Consequently, the inverted input signal VinN at the output of the first inverter 24 is at high or one. The output of the second inverter 25 goes to zero which concurrently turns on the transistor of the first switch M10 and turns off the transistor of the second switch M17. The output of the third inverter 26 goes to high which concurrently turns on the transistor of the fourth switch M18 and turns off the transistor of the third switch M11. Transistors M10 and M18 are working as current generators. Thereby, an output delay of the inverted internal signal VintN at the output of the third inverter 26 is determined by its overlap with an edge of the internal signal Vint at the output of the second inverter 25. This results in a synchronization of the edges of the internal signal Vint and the inverted internal signal VinN.

Whenever for some reason, one output is slower than the other in changing his state, for example, the internal signal Vint is slower because it has one inverter more, the circuit is unbalanced in such a way that the current in PMOS the transistors is higher than the current in the NMOS transistors. Consequently, the internal signal Vint is switching faster than the inverted internal signal VintN, thereby recovering the eventual delay between the two outputs 22, 23. The speed is proportional to the current flowing on the inverters and inversely proportional to the size of the first and second capacitors C1, C2. Considering a good matching of the capacitors C1, C2, or the use of trimmable capacitors and the sharing of current generators between the inverters, equal slopes of the internal signal Vint and the inverted internal signal VintN are achieved.

FIG. 3 shows an exemplary implementation of the proposed phase alignment circuit. The circuit depicted in FIG. 3 coincides with the circuit of FIG. 2, wherein FIG. 3 shows implementation possibilities of the first, second and third inverter on the basis of complementary transistor pairs.

The first inverter 24 comprises in this example a first pair of complementary MOS transistors M9, M16, in which M9 is realized as a PMOS transistor, while M16 is realized as an NMOS transistor. The second inverter 25 comprises a second pair of complementary MOS transistors M12, M14. Transistor M12 is realized as a PMOS transistor, while transistor M14 is realized as an NMOS transistor. The third inverter 26 comprises a pair of complementary MOS transistors M13, M15. Therein, transistor M13 is realized as a PMOS transistor, while transistor M15 is implemented as an NMOS transistor.

Figure 4:
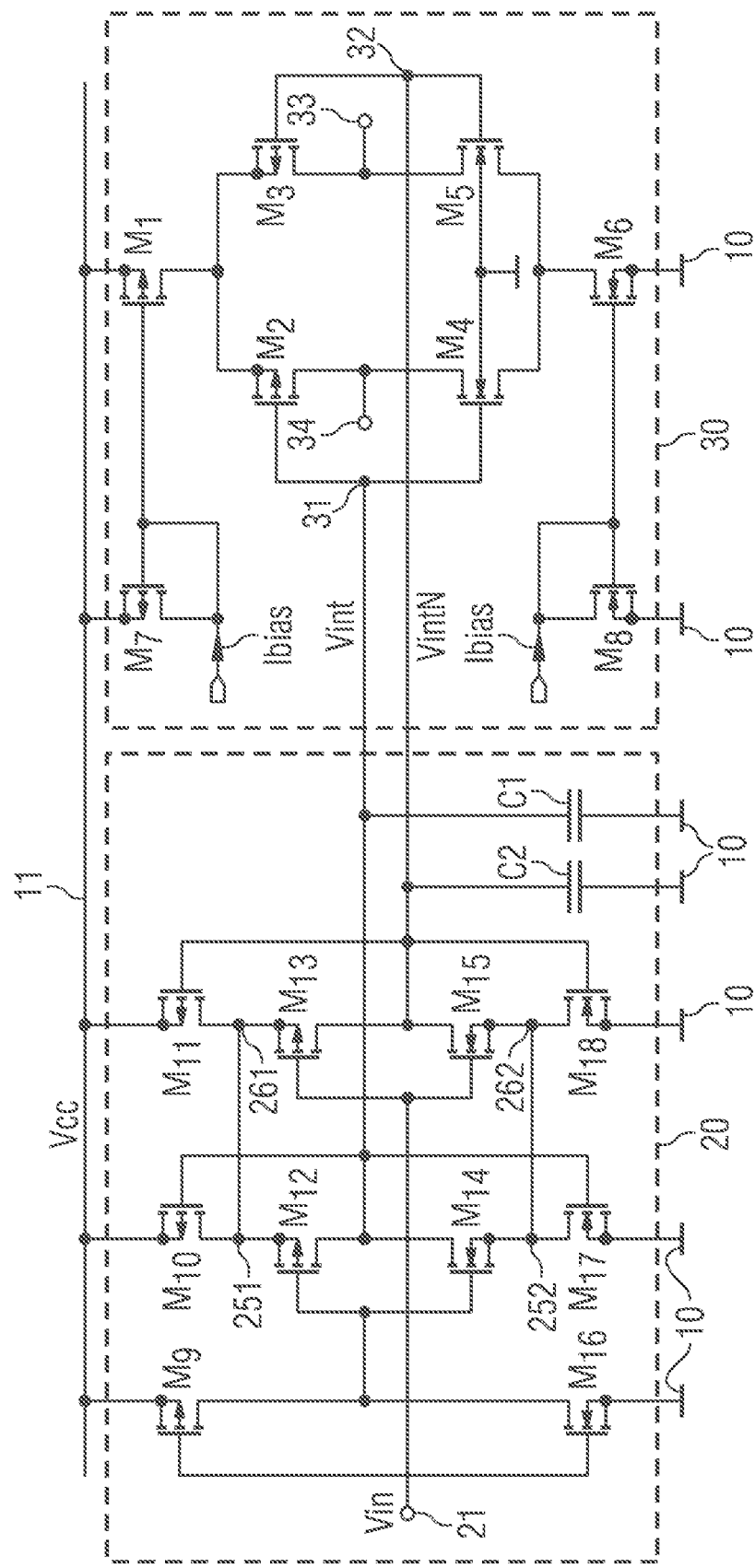
FIG. 4 shows an exemplary implementation of the proposed driver circuit for LVDS.

FIG. 4 shows an exemplary implementation of the proposed driver circuit for LVDS. The driver circuit comprises the phase alignment circuit 20 as depicted in FIG. 3 and the output driver circuit 30 which is shown with more implementation details. The supply voltage terminal 11 is supplied with a supply voltage VCC. The output driver circuit 30 comprises transistors M1, M2, M3, M4, M5, M6, M7, and M8. Furthermore, the output driver circuit 30 comprises a current source which provides a constant current Ibias. Transistors M1, M2, M3 and M7 are realized as PMOS transistors, while transistors M4, M5, M6 and M8 are realized as NMOS transistors. The output driver circuit 30 realizes a standard LVDS driver which receives digital signals, i.e. the internal signal Vint and VintN and provides the output signal Vout, as well as the inverted output signal VoutN. Transistors M1 and M6 act as current generators for the PN structure formed by transistors M2, M3, M4 and M5. Therein transistors M2 and M4 act as an inverter, and transistors M3 and M5 act as an inverter.

By using the phase alignment circuit 20, an inverter time shift between the input signal and its inverted form at the input of the output driver circuit 30 which is present in state of the art implementations is recovered or avoided.

Consequently, the signals generated by the phase alignment circuit 20, i.e. the internal signal Vint and the inverted internal signal VintN are synchronized in phase which avoids overshoot and voltage spikes at the outputs 33 and 34 of the output driver circuit 30.

Alternatively, an output driver known to those skilled in the art may be employed for implementing the output driver circuit 30.

Figure 5:
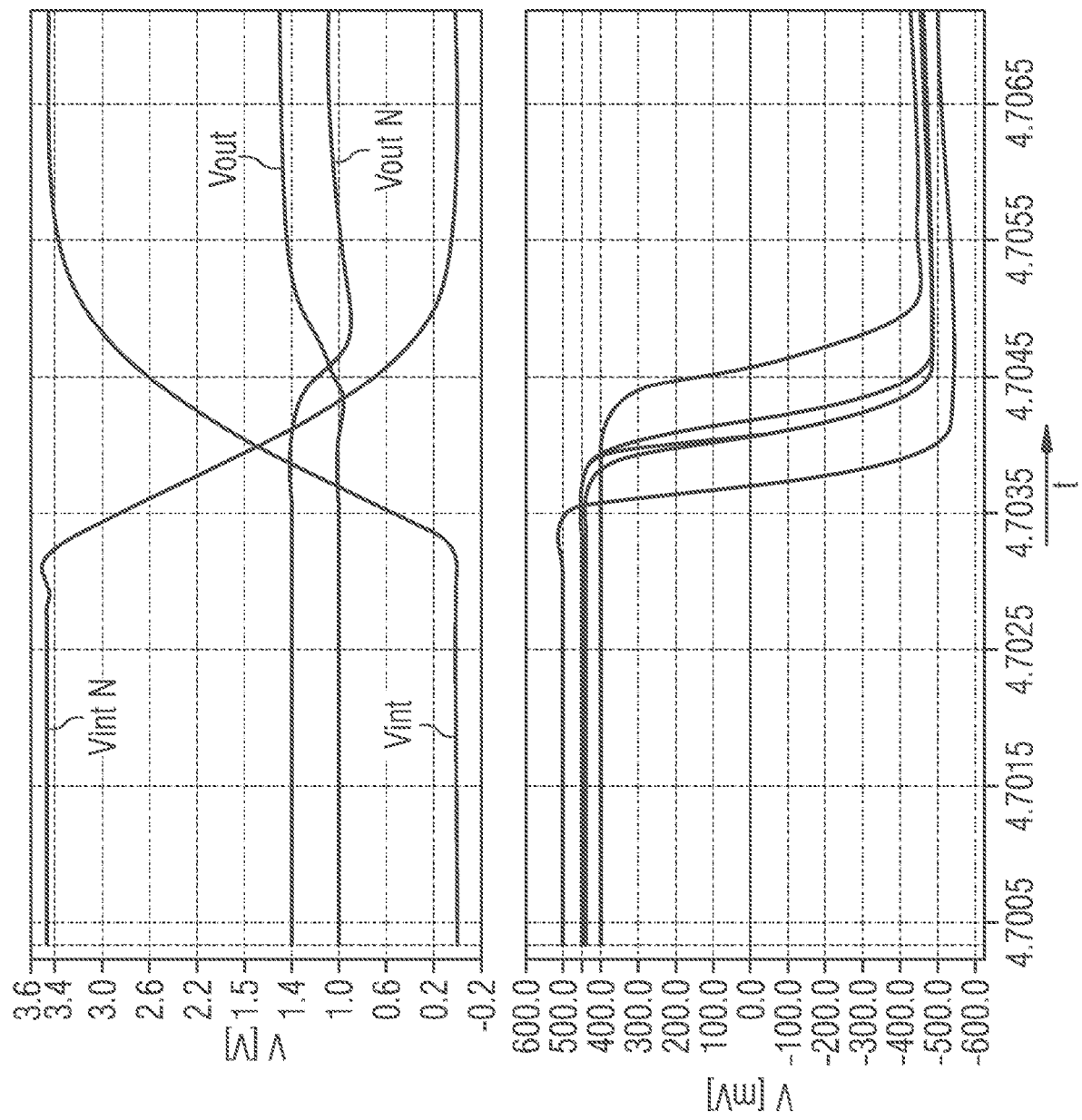
FIG. 5 shows exemplary signal diagrams for the proposed driver circuit for LVDS.

FIG. 5 shows exemplary signal diagrams for the proposed driver circuit for LVDS. The upper part of FIG. 5 shows the course of the internal signal Vint, the inverted internal signal VintN, the output signal Vout and the inverted output signal VoutN with respect to time t in microseconds. The signals are realized as voltages. A transition of the internal signal Vint from logical low to logical high coincides with a transition of the inverted internal signal VintN from a logical high to a logical low. It can be easily determined that the signals cross at approximately half of the supply voltage which is about 3.5 V. The output signals Vout and VoutN are provided without overshoots, also crossing in the middle of the differential output voltage range.

The circuit described is able to provide the internal signal Vint and its inverted form VintN crossing each other in the middle of the supply voltage range for substantially all conditions of the supply voltage and temperature and independent from the good or bad matching of its components.

The lower part of FIG. 5 shows the differential output voltage, i.e. the voltage difference between the output signal Vout and the inverted output signal VoutN, at different corners.

It will be appreciated that the invention is not limited to the disclosed embodiments and to what has been particularly shown and described hereinabove. Rather, features recited in separate dependent claims or in the description may advantageously be combined. Furthermore, the scope of the invention includes those variations and modifications, which will be apparent to those skilled in the art and fall within the scope of the appended claims. The term "comprising" used in the claims or in the description does not exclude other elements or steps of a corresponding feature or procedure. In case that the terms "a" or "an" are used in conjunction with features, they do not exclude a plurality of such features. Moreover, any reference signs in the claims should not be construed as limiting the scope.

The invention claimed is:

1. A driver circuit for low voltage differential signaling, LVDS, comprising
   a phase alignment circuit comprising an input configured to receive an input signal, a first output configured to provide an internal signal as a function of the input signal, and a second output configured to provide an inverted internal signal, which is the inverted signal of the internal signal, and
   an output driver circuit coupled to the phase alignment circuit, the output driver circuit comprising a first input configured to receive the internal signal, a second input configured to receive the inverted internal signal, a first output configured to provide an output signal as a function of the internal signal and a second output configured to provide an inverted output signal which is the inverted signal of the output signal,
   wherein the phase alignment circuit is configured to provide the inverted internal signal with its phase being aligned to a phase of the internal signal, wherein the phase alignment circuit comprises a first inverter having an input, which is connected to the input of the phase alignment circuit, an output configured to provide an inverted input signal from the input signal, a first inverter supply terminal, which is connected to a supply voltage terminal, and a first inverter reference terminal, which is connected to a reference voltage terminal,
   a second inverter having an input, which is connected to the output of the first inverter, an output configured to provide the internal signal from the inverted input signal, a second inverter supply terminal, which is connected to the supply voltage terminal via a first switch, and a second inverter reference terminal, which is connected to the reference voltage terminal via a second switch, and
   a third inverter having an input which is connected to the input of the first inverter and an output configured to provide the inverted internal signal from the input signal, a third inverter supply terminal, which is connected to the second inverter supply terminal of the second inverter and to the supply voltage terminal via a third switch, and a third inverter reference terminal which is connected to the second inverter reference terminal of the second inverter and to the reference voltage terminal via a fourth switch.

2. The driver circuit according to claim 1, wherein
   the first switch has a control input which is connected to the output of the second inverter,
   the second switch has a control input which is connected to the output of the second inverter,
   the third switch has a control input which is connected to the output of the third inverter, and
   the fourth switch has a control input which is connected to the output of the third inverter.

3. The driver circuit according to claim 1, wherein
   the first inverter comprises a first pair of complementary metal-oxide-semiconductor, MOS, transistors,
   the second inverter comprises a second pair of complementary MOS transistors,
   the third inverter comprises a third pair of complementary MOS transistors.

4. The driver circuit according to claim 1, wherein
   the first switch comprises a MOS transistor with a controlled section connected between the supply voltage terminal and the second inverter supply terminal of the second inverter,
   the second switch comprises a MOS transistor with a controlled section connected between the reference voltage terminal and the second inverter reference terminal of the second inverter,
   the third switch comprises a MOS transistor with a controlled section connected between the supply voltage terminal and the third inverter supply terminal of the third inverter,
   the fourth switch comprises a MOS transistor with a controlled section connected between the reference voltage terminal and the third inverter reference terminal of the third inverter.

5. The driver circuit according to claim 1, wherein the phase alignment circuit further comprises
   a first capacitor which is coupled to the first output of the phase alignment circuit and to the reference potential terminal, and a second capacitor which is coupled to the second output of the phase alignment circuit and to the reference potential terminal.

6. The driver circuit according to claim 1, wherein the input signal comprises a digital signal.

7. The driver circuit according to claim 1, wherein the output driver circuit is configured to provide the output signal and the inverted output signal using a constant current, wherein a direction of the current represents a logical level of the output signal and the inverted output signal.

8. A line driver arrangement for low voltage differential signaling, LVDS, comprising the driver circuit according to claim 1, wherein the input signal comprises a voltage signal and the output signal and the inverted output signal represent a differential voltage output signal of the line driver arrangement.

\* \* \* \* \*